(12) United States Patent
Correale, Jr.

(10) Patent No.: US 6,900,662 B2
(45) Date of Patent: May 31, 2005

(54) LEVEL TRANSLATOR CIRCUIT FOR POWER SUPPLY DISABLEMENT

(75) Inventor: Anthony Correale, Jr., Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/439,362

(22) Filed: May 16, 2003

(65) Prior Publication Data

US 2004/0227540 A1 Nov. 18, 2004

(51) Int. Cl.$^7$ ............................................. H03K 19/094
(52) U.S. Cl. ........................................ 326/68; 327/333
(58) Field of Search ....................... 326/68, 81; 327/333

(56) References Cited

U.S. PATENT DOCUMENTS

| | | |
|---|---|---|
| 5,298,808 A | 3/1994 | Terrell et al. |
| 5,378,943 A | 1/1995 | Dennard |
| 5,592,108 A | 1/1997 | Tsukahara |
| 5,973,549 A | 10/1999 | Yuh |
| 6,130,557 A | 10/2000 | Drapkin et al. |
| 6,265,896 B1 | 7/2001 | Podlesny et al. |
| 6,268,744 B1 | 7/2001 | Drapkin et al. |
| 6,566,932 B2 * | 5/2003 | Yoon ........................... 327/333 |

OTHER PUBLICATIONS

*5–Volt Signal Level Shifter in a 3–Volt Cmos* Circuit, IBM Technical Disclosure Bulletin, Dec. 1989, pp. 454–455.

* cited by examiner

*Primary Examiner*—Daniel D. Chang
(74) *Attorney, Agent, or Firm*—Sawyer Law Group LLP; Scott W. Reid

(57) ABSTRACT

A level translator circuit for use between a transmitting voltage potential circuit and a receiving voltage potential circuit is disclosed. The translator circuit includes a first transistor coupled to the transmitting voltage potential circuit and a clamping mechanism coupled to the first transistor. The circuit also includes a second transistor coupled to the first transistor, a higher voltage potential and the receiving voltage potential circuit. The circuit includes a third transistor coupled to the receiving voltage potential circuit, the higher voltage potential and the second transistor. Finally, the circuit includes a fourth transistor coupled to the receiving voltage potential circuit, and to a ground potential. The clamping mechanism clamps the input of the translator circuit such than an appropriate logic level is provided to the receiving voltage potential circuit and the leakage current is minimized when the transmitting voltage potential circuit is disabled. Accordingly, a level translator circuit is provided that operates effectively even when the transmitting voltage potential circuit is disabled. In addition, leakage current is minimized for the two distinct power supplies by clamping the input of the circuit such that an appropriate logical level is provided at the output of the circuit.

6 Claims, 6 Drawing Sheets

LEVEL TRANSLATOR CIRCUIT FOR POWER SUPPLY DISABLEMENT

CROSS-RELATED APPLICATION

The present application is related to application Ser. No. 10/439,860 entitled "Level Translator Circuit for Power Supply Disablement," filed on even date herewith.

FIELD OF THE INVENTION

The present invention relates generally to a level translator circuit and more particularly to a level translator circuit for use between circuits having distinct power supplies wherein the lower voltage supply may be deactivated.

BACKGROUND OF THE INVENTION

Circuits for voltage level translation are utilized in a variety of applications. Level translator circuits are employed to allow circuits operating at different power supply potentials to communicate with one another. Typically, the area, power and performance of the translator circuit are critical to the operations of each of the different circuits.

FIG. 1 is a simple block diagram of a level translator system 10. The system 10 includes a level translator circuit 12 coupled between transmitting circuit 14 and downstream receiving circuit 16. In this embodiment, Vddl circuit 14 is coupled to a lower voltage supply and Vddh circuit 16 is coupled to a higher voltage supply. Level translation is required only when a circuit on a lower voltage supply interfaces with one on a higher voltage supply. The level translates due to the voltage difference between Vddl circuit 14 and Vddh circuit 16.

It is important that a level translator circuit operate efficiently, utilize minimal power, and translate from one voltage supply potential to another as quickly as possible. To conserve standby or leakage power it is important to be able to turn off the transmitting circuit, i.e. circuit 14. It is also important to be able to provide a valid Vddl and Vddh level and minimize leakage current at all times, even when the transmitting circuit 14 is disabled. For a more detailed description of this issue, refer now to the following discussion in conjunction with the accompanying figures.

FIG. 2 illustrates a first embodiment of a conventional level translator circuit 100 coupled between distinct power supplies. In this circuit, cross-coupled pfet transistors 102 and 106 connected to the Vddh circuit 16' are used in conjunction with pull-down nfet transistors 104 and nfet transistor 108 and an inverter 110 which is connected to the Vddl supply. The circuit 100 operates as follows: For propagation of a logical '0' from the Vddl circuit 14', transistor 104 is off, the inverter 110 produces a logical '1' at node-2 in the form of Vddl volts, which then turns on nfet transistor 108, driving node-Z to a logical '0', which in turn causes pfet transistor 102 to turn on, thereby raising node-1 to Vddh volts, which in turn causes pfet transistor 106 to turn off. Since the gate of nfet transistor 106 is at Vddh and the source of pfet transistor 106 is also at Vddh, there is no leakage. This circuit is non-inverting.

For propagation of a logical '1' from the Vddl circuit 14', nfet transistor 104 is on, resulting in node-1 being drawn toward a logical '0'. The inverter 110 produces a logical '0' at node 2 in the form of 0 volts, which results in nfet transistor 108 turning off. Since node-1 is being drawn to 0 volts, pfet transistor 106 is now on, driving node Z to a logical '1' in the form of Vddh volts, which in turn reinforces the node 1 potential of '0' by turning off pfet transistor 102.

Now, if Vddl circuit 14''s power were turned off, e.g., set to 0 volts to conserve power, while Vddh remained active, the output levels emanating from the Vddl circuit 14' would be 0 volts. In addition, the output of the inverter 110 within the level translator would also be at 0 volts. When the Vddl supply is active, differential levels are supplied to the nfet transistors 104 and 108 comprising the level translator. Now with the Vddl supply being cut off, both nfet transistors 104 and 108 now receive the same 0 volts. This results in the output, node Z and node 1 achieving Vddh−|Vtp|. This will result in leakage in the Vddh circuit 16' that is driving down stream.

FIG. 3 illustrates a second embodiment of a conventional level translator circuit 200 coupled between distinct power supplies. In this configuration, the inverter is eliminated and the source of nfet transistor 204 is connected to the gate input of the nfet transistor 208, which is connected to the output of the Vddl circuit 14''. Also, the gate of nfet transistor 204 is connected directly to the Vddl supply. This circuit 200 operates as follows: For propagation of a logical '0' from the Vddl circuit 14'', nfet transistor 204 is on and nfet transistor 208 is off, thereby relinquishing control of node Z. Since nfet transistor 204 is on, node 1 is now at 0-volts turning on pfet transistor 206, raising node-Z to Vddh volts, which in turn shuts off pfet transistor 202, which reinforces the node 1 level of 0 volts. Also note that this circuit configuration is inverting.

For propagation of a logical '1' from the Vddl circuit 14'', nfet transistor 204 is on until the voltage at node 1 can rise to Vddl−Vtn. This voltage rise begins to shut off pfet transistor 206. Nfet transistor 208 is now active and pulling node-Z low, which in turn activates pfet transistor 202, which raises the node 1 potential to Vddh, which in turn shuts off the leakage from pfet transistor 206. Once again, if Vddl were turned off, e.g., set to 0 volts to conserve power while Vddh remained active, all levels emanating from the Vddl circuit 14'' would be 0 volts.

What is needed therefore is a means to provide a downstream voltage level out of the level translator when the transmitting voltage potential circuit is shut off. The present invention addresses such a need.

SUMMARY OF THE INVENTION

A level translator circuit for use between a transmitting voltage potential circuit and a receiving voltage potential circuit is disclosed. The translator circuit includes a first transistor coupled to the transmitting voltage potential circuit and a clamping mechanism coupled to the first transistor. The circuit also includes a second transistor coupled to the first transistor, a higher voltage potential and the receiving voltage potential circuit. The circuit includes a third transistor coupled to the receiving voltage potential circuit, the higher voltage potential and the second transistor. Finally, the circuit includes a fourth transistor coupled to the transmitting voltage potential circuit, to the receiving voltage potential circuit, and to a ground potential. The clamping mechanism clamps a control node of the translator circuit such that an appropriate logic level is provided to the receiving voltage potential circuit and the leakage current is minimized when the transmitting voltage potential circuit's power supply is disabled.

Accordingly, a level translator circuit is provided that operates effectively even when the transmitting voltage potential circuit is disabled. In addition, leakage current is minimized for the two distinct power supplies by clamping the input of the circuit such that an appropriate logical level is provided at the output of the circuit.

DETAILED DESCRIPTION

The present invention relates generally to a level translator circuit and more particularly to a level translator circuit for use between circuits having distinct power supplies wherein the lower voltage supply may be deactivated. The following description is presented to enable one of ordinary skill in the art to make and use the invention and is provided in the context of a patent application and its requirements. Thus, the present invention is not intended to be limited to the embodiment shown, but is to be accorded the widest scope consistent with the principles and features described herein.

A system and method in accordance with the present invention clamps a control node of a level translator circuit such that the appropriate logical level is provided at the output of the circuit and the leakage current is minimized when the transmitting voltage potential circuit is turned off. For a further discussion of the features of the present invention, refer now to the following description in conjunction with the accompanying figures.

Figure 1:
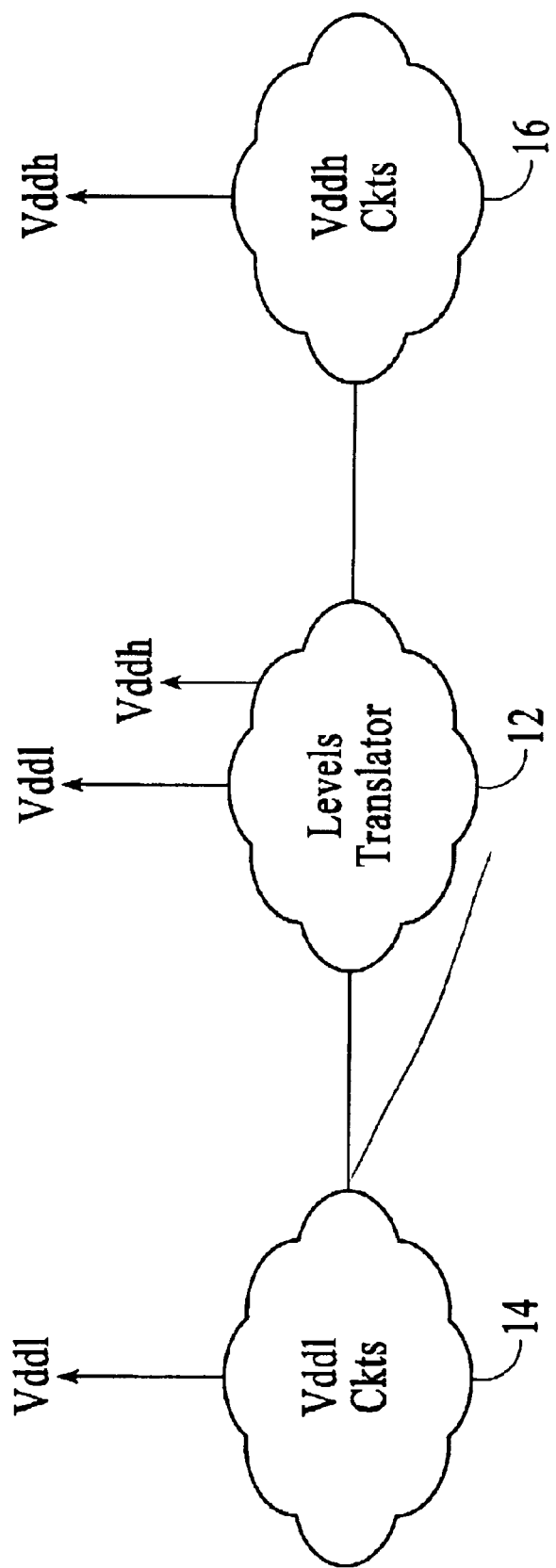
FIG. 1 is a simple block diagram of a level translator system.
Figure 2:
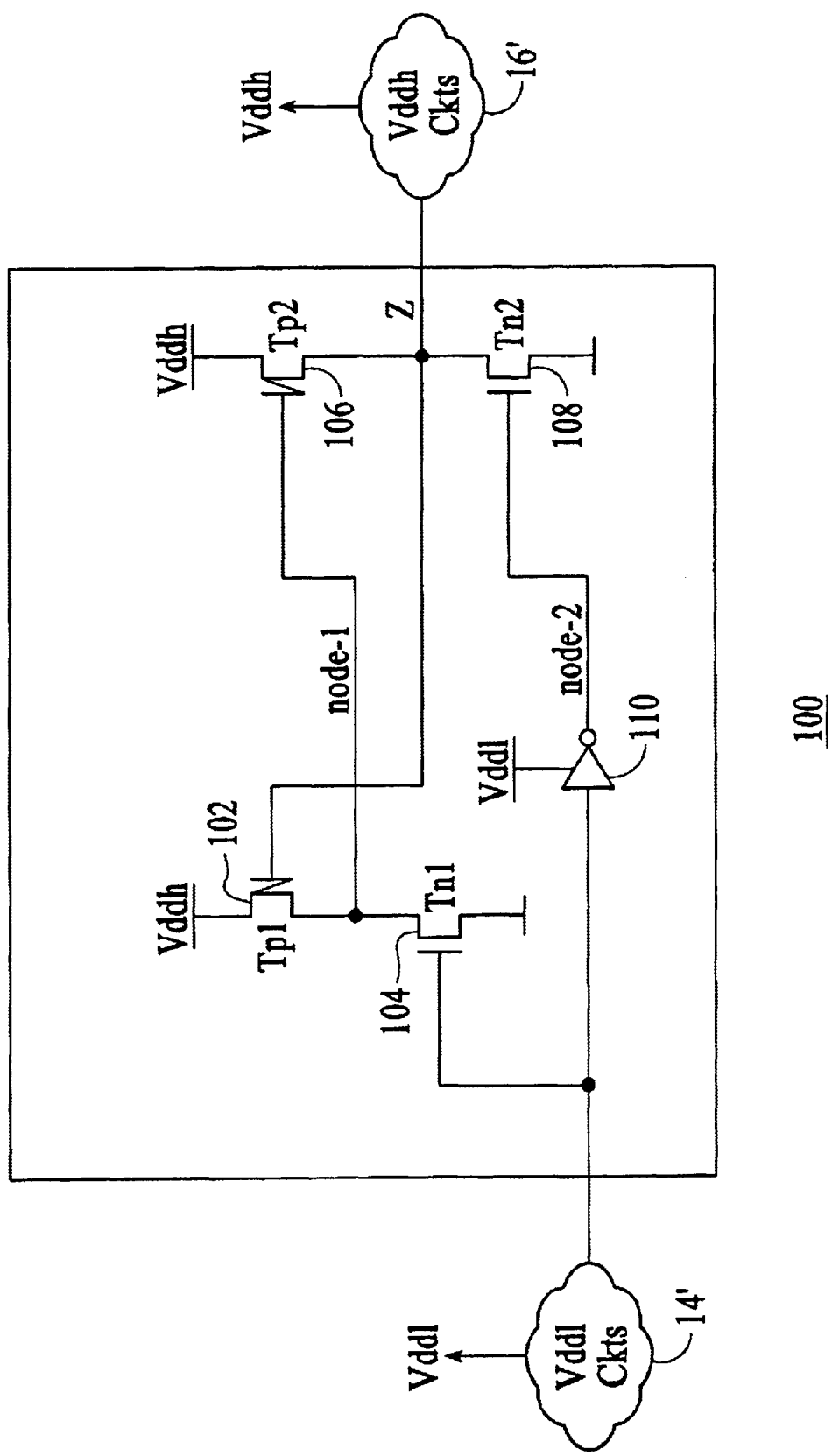
FIG. 2 illustrates a first embodiment of a conventional level translator circuit coupled between distinct power supplies.
Figure 3:
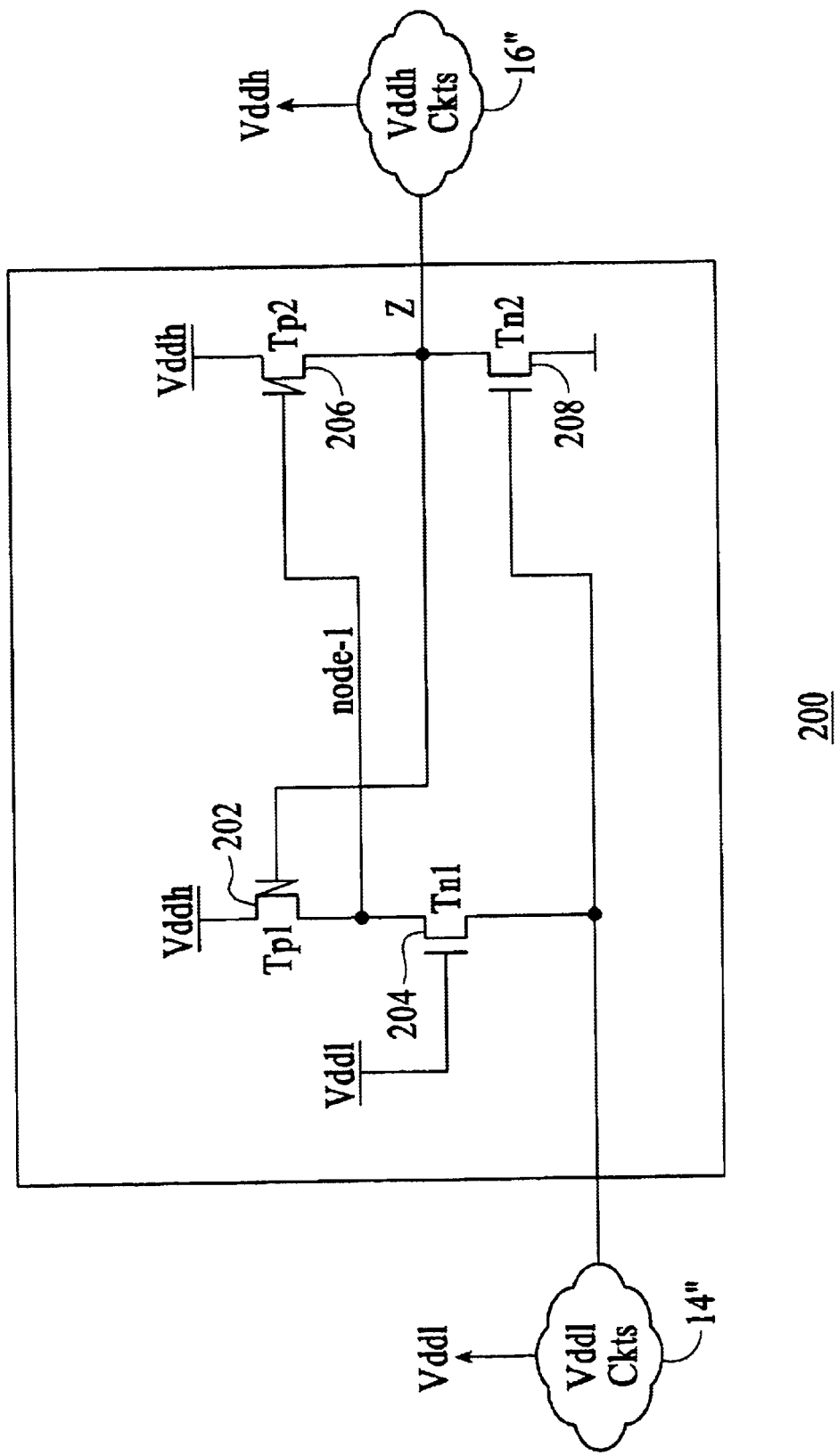
FIG. 3 illustrates a second embodiment of a conventional level translator circuit coupled between distinct power supplies.
Figure 4:
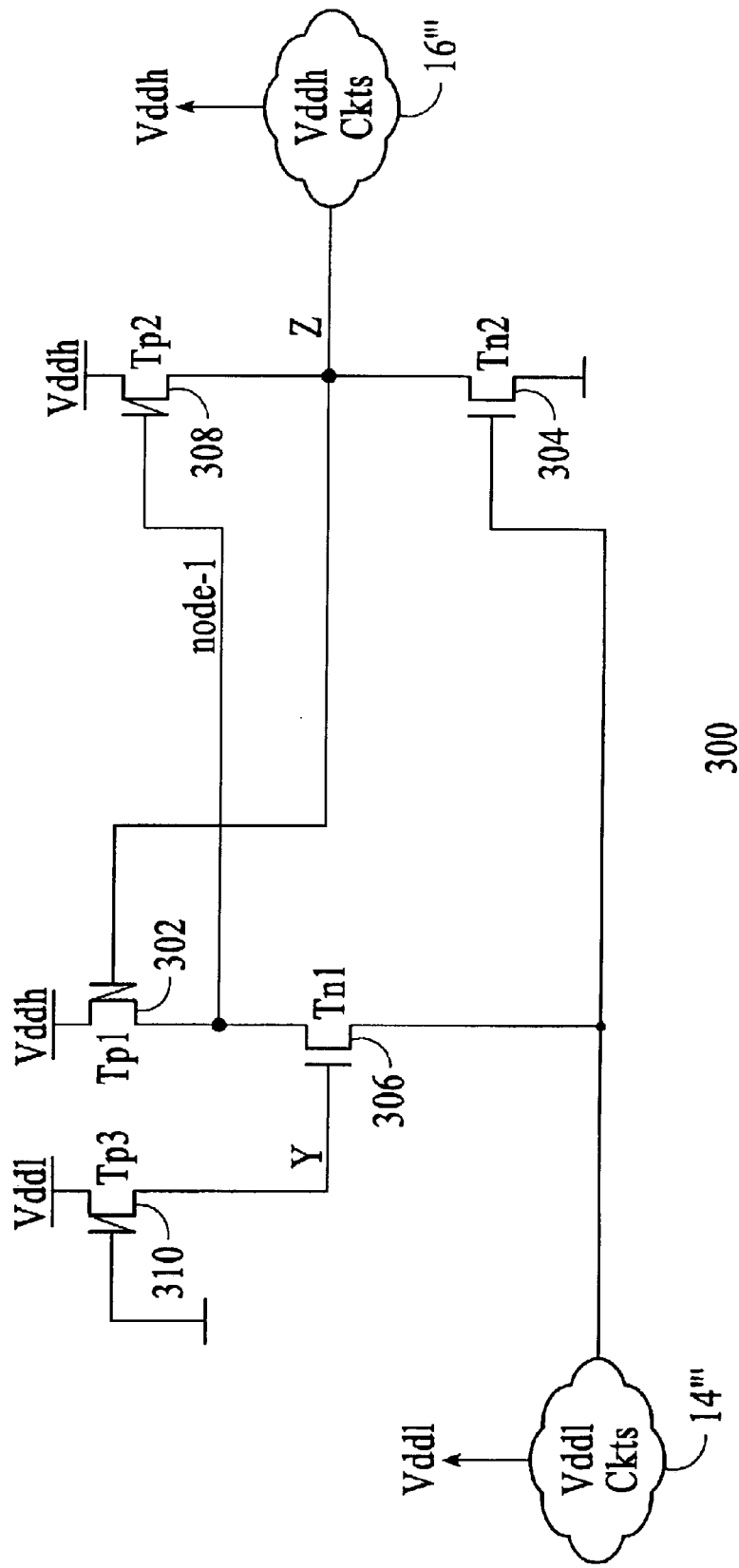
FIG. 4 is a first embodiment of a level translator circuit in accordance with the present invention.

FIG. 4 is a first embodiment of a level translator circuit 300 in accordance with the present invention. In this level translator configuration, the gate of nfet transistor 306 is now connected to the drain of a new pfet transistor 310. The source of pfet transistor 310 is connected to the low supply Vddl, and its gate is connected to ground. Hence, this circuit is basically the same as shown in FIG. 3 with the exception of the connectivity to the gate of nfet transistor 306. The circuit behaves the same as that of FIG. 3 when Vddl is active but solves the leakage problem when Vddl is '0'.

This can be shown as follows: when Vddl is set to 0 volts after being held at Vddl volts, the gate of nfet transistor 306, a control node—node Y—is clamped to |Vtp| volts. Since |Vtp| is usually quite similar to Vtn, nfet transistor 306 will conduct, albeit weakly. This will help discharge node 1 to 0 volts which will cause node Z to rise to Vddh volts, thereby shutting off pfet transistor 302. Hence, node Z is held at Vddh volts.

Control node Y is held at |Vtp| volts dynamically and over time this voltage may leak down to ground, thereby eliminating the weak conductance of nfet transistor 306, but the cross-coupled pfet transistors 302 and 308 are already set. Of course, node 1 is then also in a dynamic mode and leakage currents from pfet transistor 302 can cause this node to rise, but never above Vdd−|Vtp|, which is no worse than the FIG. 3 configuration.

Figure 5:
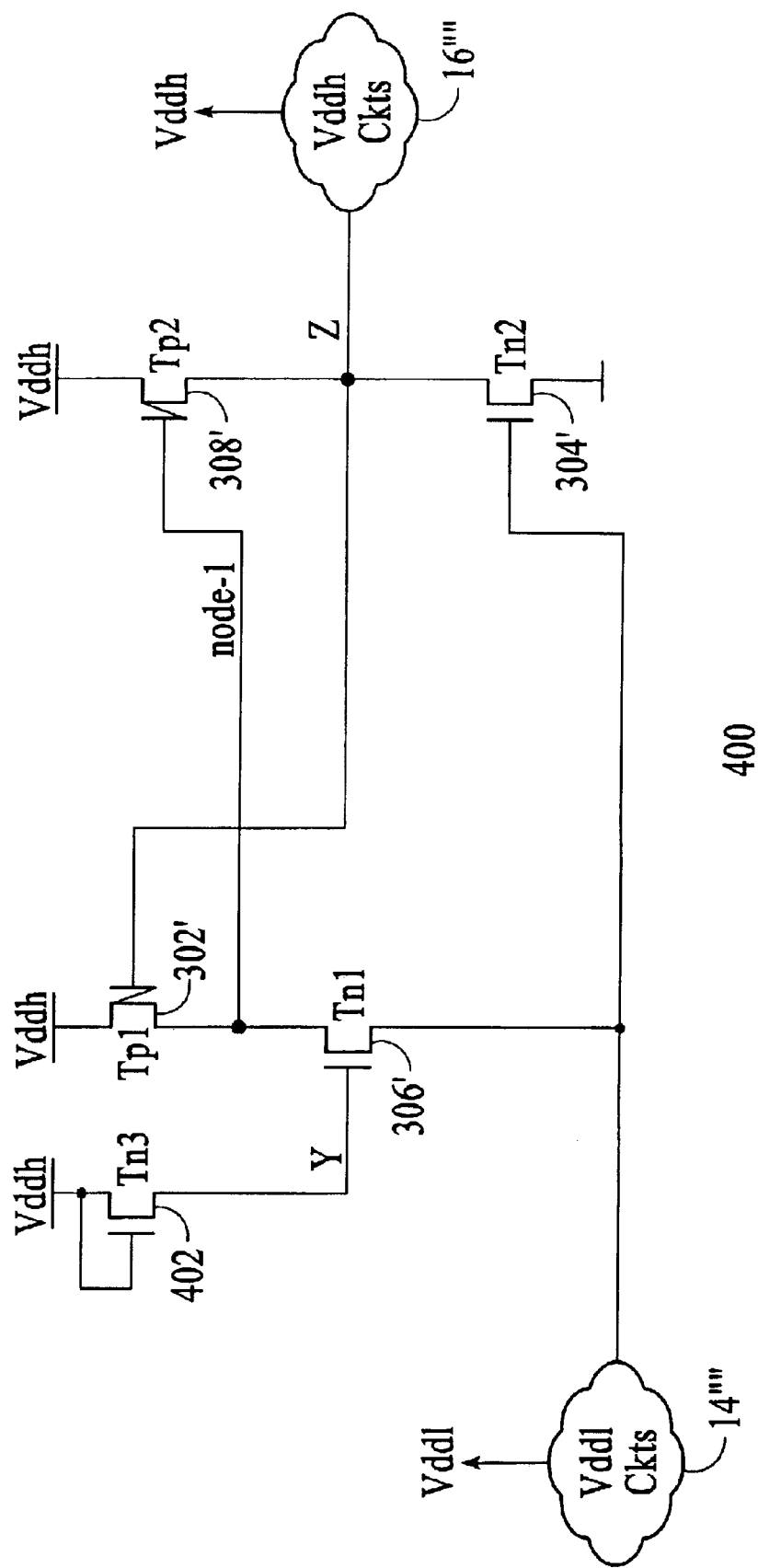
FIG. 5 is a second embodiment of a level translator circuit in accordance with the present invention.

A second embodiment of a level translator circuit 400 in accordance with the present invention that could be employed to alleviate the leakage power during the time period when Vddl is deactivated is illustrated in FIG. 5. In this embodiment, an nfet transistor 402 is coupled to the gate of transistor 306' and also its drain and gate is tied to Vddh. In this embodiment, there is no Vddl power supply associated with the level translator. This circuit behaves as follows: Control node Y is held clamped at Vddh−Vtn; when Vddl is deactivated, Vddl=0 volts, then nfet transistor 306' is active and passes a '0' value to node 1, thereby activating pfet transistor 308' which results in node Z rising to Vddh, which in turn causes pfet transistor 302' to be turned off. Nfet transistor 304' is also held off by Vddl being off. There is no leakage in this mode. There can be leakage, however, when Vddl is active and the delta between Vddl and Vddh is more than Vtn. The leakage can be alleviated by adding more devices configured like nfet transistor 402 in series with nfet transistor 402.

Figure 6:
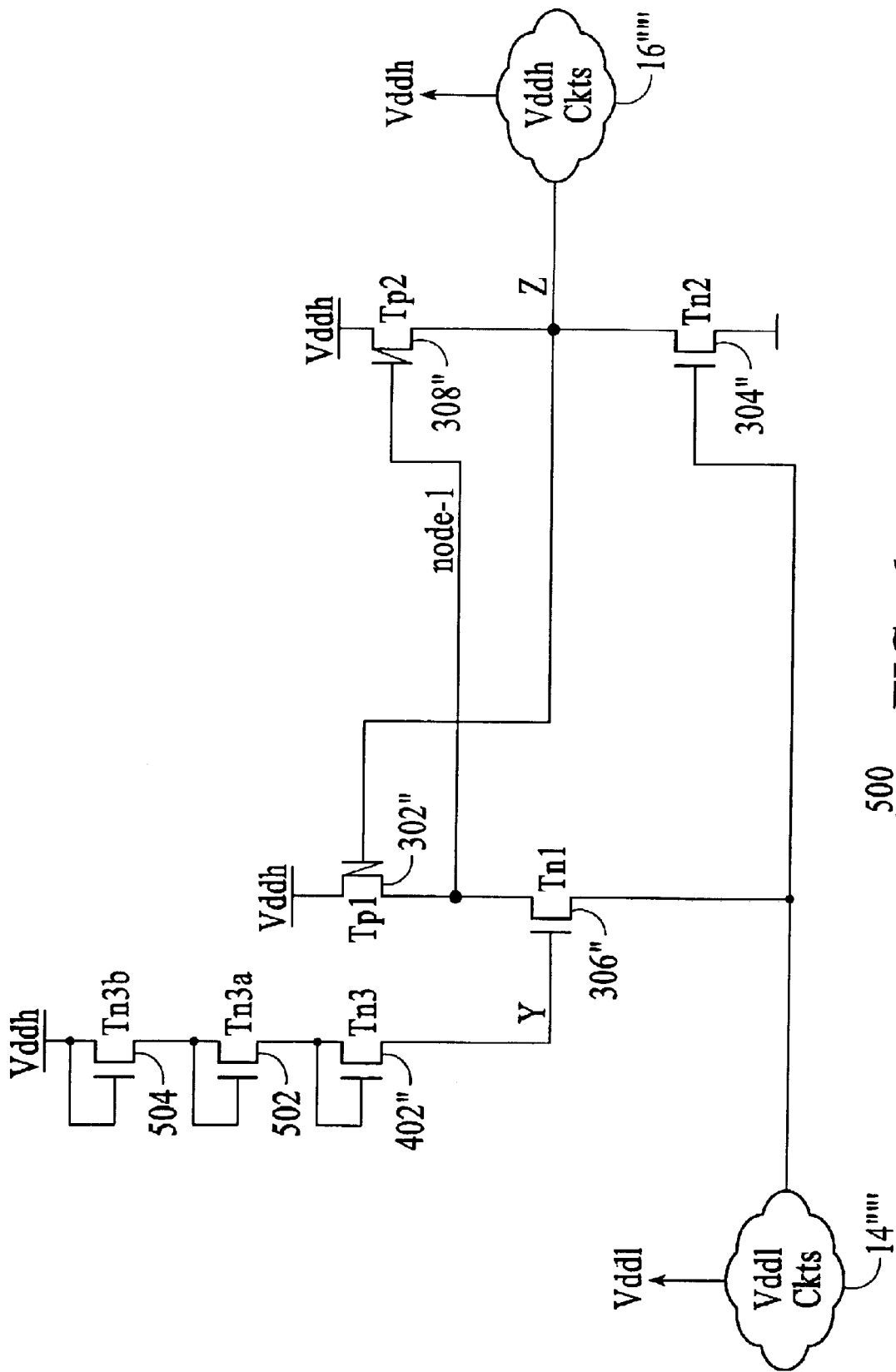
FIG. 6 is a third embodiment of a level translator circuit in accordance with the present invention.

FIG. 6 is a third embodiment of a level translator circuit 500 in accordance with the present invention. In this embodiment three nfet transistors 402", 502 and 504 are illustrated. These transistors, 402", 502 and 504, allow the delta between Vddl and Vddh to be 3*Vtn as the node Y voltage will be clamped to Vddh−3Vtn.

Accordingly, a level translator circuit is provided that operates effectively even when the transmitting voltage potential circuit is disabled. In addition, leakage current is minimized for two distinct power supplies by clamping the control node of the circuit such that an appropriate logical level is provided at the output of the circuit.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A level translator circuit for use between a transmitting voltage potential circuit and a receiving voltage potential circuit; the translator circuit comprising:

a first transistor coupled to the transmitting voltage potential circuit;

a clamping mechanism coupled to the first transistor, wherein the clamping mechanism comprises a fifth transistor coupled to the gate of the first transistor and a higher voltage potential;

a second transistor coupled to the first transistor, the higher voltage potential and the receiving voltage potential circuit;

a third transistor coupled to the receiving voltage potential circuit, the higher voltage potential and the second transistor; and a fourth transistor coupled to the transmitting voltage potential circuit, the receiving voltage potential circuit, and to a ground potential, wherein the clamping mechanism clamps a control node of the translator circuit such that an appropriate logic level is provided to the receiving voltage potential circuit and the leakage current is minimized when the transmitting voltage potential circuit's power supply is disabled.

2. The level translator circuit of claim 1 wherein the transmitting voltage potential circuit comprises a lower voltage potential circuit and the receiving voltage potential circuit comprises a higher voltage potential circuit.

3. The level translator circuit of claim 1 wherein the first and fourth transistors comprise nfet transistors and the second and third transistors comprise pfet transistors.

4. The level translator circuit of claim 1 wherein the fifth transistor comprises a pfet transistor.

5. The level translator of claim 1 wherein the fifth transistor comprises an nfet transistor.

6. The level translator circuit of claim 1 wherein the clamping mechanism comprises a transistor stack coupled between the fifth transistor and the higher voltage potential.

* * * * *